(12) United States Patent
Chou

(10) Patent No.: US 6,449,205 B1
(45) Date of Patent: Sep. 10, 2002

(54) 1-T MEMORY STRUCTURE CAPABLE OF PERFORMING HIDDEN REFRESH AND AN OPERATING METHOD APPLIED THERETO

(75) Inventor: Jonathan Y. P. Chou, Taipei Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 09/880,784

(22) Filed: Jun. 15, 2001

(30) Foreign Application Priority Data

Mar. 27, 2001 (TW) ........................................ 90107145 A

(51) Int. Cl.$^7$ ................................................. G11C 8/00
(52) U.S. Cl. .............. 365/222; 365/189.05; 365/230.08
(58) Field of Search ............................ 365/222, 230.03, 365/189.05, 189.07, 230.08, 236

(56) References Cited

U.S. PATENT DOCUMENTS 6,005,818 A * 12/1999 Ferrant ........................ 365/222
6,154,409 A * 11/2000 Huang et al. ................ 365/222
6,222,785 B1 * 4/2001 Leung ......................... 365/222
6,282,606 B1 * 8/2001 Holland ....................... 365/222
6,285,578 B1 * 9/2001 Huang ......................... 365/222

* cited by examiner

Primary Examiner—Trong Phan
(74) Attorney, Agent, or Firm—Birch, Stewart, Kolasch & Birch, LLP

(57) ABSTRACT

This invention relates to a 1-T memory structure capable of performing hidden refresh and an operating method applied to the structure, which uses a data latch and an electrically parallel path to effectively solve the lost data problem in the art from the collision of access actions and refresh actions. The structure includes: a plurality of memory arrays for storing data signal; a plurality of sense amplifiers for amplifying the data signal of the respective memory array and temporarily storing the amplified data signal; a selector for selecting the amplified data signal through a bus based on a cycle-indicative signal; and a shared data latch for receiving and storing the data signal from the selector.

14 Claims, 5 Drawing Sheets

1-T MEMORY STRUCTURE CAPABLE OF PERFORMING HIDDEN REFRESH AND AN OPERATING METHOD APPLIED THERETO

BACKGROUND OF THE INVENTION

1. Field of the Invention

This invention relates to a memory structure, and particularly to a 1-T memory structure capable of performing hidden refresh, and an operating method applied to the structure, which uses a data latch and an electrically parallel path to effectively eliminate data loss in the prior art from the collision of access actions and refresh actions.

2. Description of the Related Art

FIG. 1 is a schematic diagram of a unit of cell of typical 1-Transistor memory. In FIG. 1, a 1-Transistor gate $G_{1T}$ and a capacitor Cap are connected in serial. As shown in FIG. 1, when the 1-T gate $G_{1T}$ is turned on by a gate-controlled signal WL, a data driver (not shown) powers the capacitor Cap through the bitline selection line BL such that the capacitor Cap is charged to a saturation state. The data signal stored in such a 1-T memory formed of FIG. 1 is increasingly lost with passing time. That is, the charge stored in the capacitor Cap is increasingly reduced. Accordingly, a data refresh to such a 1-T memory is necessary. For a 1-T Dynamic Random Access Memory (DRAM), the frequency of data refresh is about once per 64 ms, and the required time for a data refresh is about 80 ns. For a 1-T Static Random Access Memory (DRAM), the frequency of data refresh is about once per 2 ms, and the required time for a data refresh is about 80 ns. Refresh actions of this frequency easily cause the collision between access actions and refresh actions and further increase the complexity of memory operations.

SUMMARY OF THE INVENTION

Therefore, an object of the invention is to provide a 1-T memory structure capable of performing hidden refresh and an operating method applied to the structure, which uses a data latch to effectively eliminate data loss in the prior art from the collision of access actions and refresh actions.

A further object of the invention is to provide a 1-T memory structure capable of performing hidden refresh and an operating method applied to the structure, which uses an electrically parallel path with simple algorithm to reduce the operating complexity and effectively solve the aforementioned data loss problems.

To realize the above and other objects, the invention provides a 1-T memory structure capable of performing hidden refresh and an operating method applied to the structure, which uses a data latch and an electrically parallel path to effectively solve the aforementioned data loss problems. The structure includes: a plurality of memory arrays for storing data signal; a plurality of sense amplifiers for amplifying the data signal of the respective memory array and temporarily storing the amplified data signal; a selector for selecting the amplified data signal through a bus based on a cycle-indicative signal; and a shared data latch for receiving and storing the data signal come from the selector. The operating method includes the following steps: determining if the collision between data access and data refresh is addressed in the same memory array; determining the currently operating mode if the collision happens in the same memory array; if on the data access cycle mode, concurrently refreshing a data signal through a respective sense amplifier bank (SAB) and accessing another data signal through a respective shared data latch (SDL); if on the data refresh cycle mode, first storing the data signal to be refreshed in the shared data latch and then restoring the data signal to be refreshed to the original memory array using the cycle-stealing technique after the data access is completed.

BRIEF DESCRIPTION OF THE DRAWINGS

The invention will be apparent by referring to the following detailed description of a preferred embodiment with referee to the accompanying drawings, wherein.

DETAILED DESCRIPTION OF THE INVENTION

Figure 1:
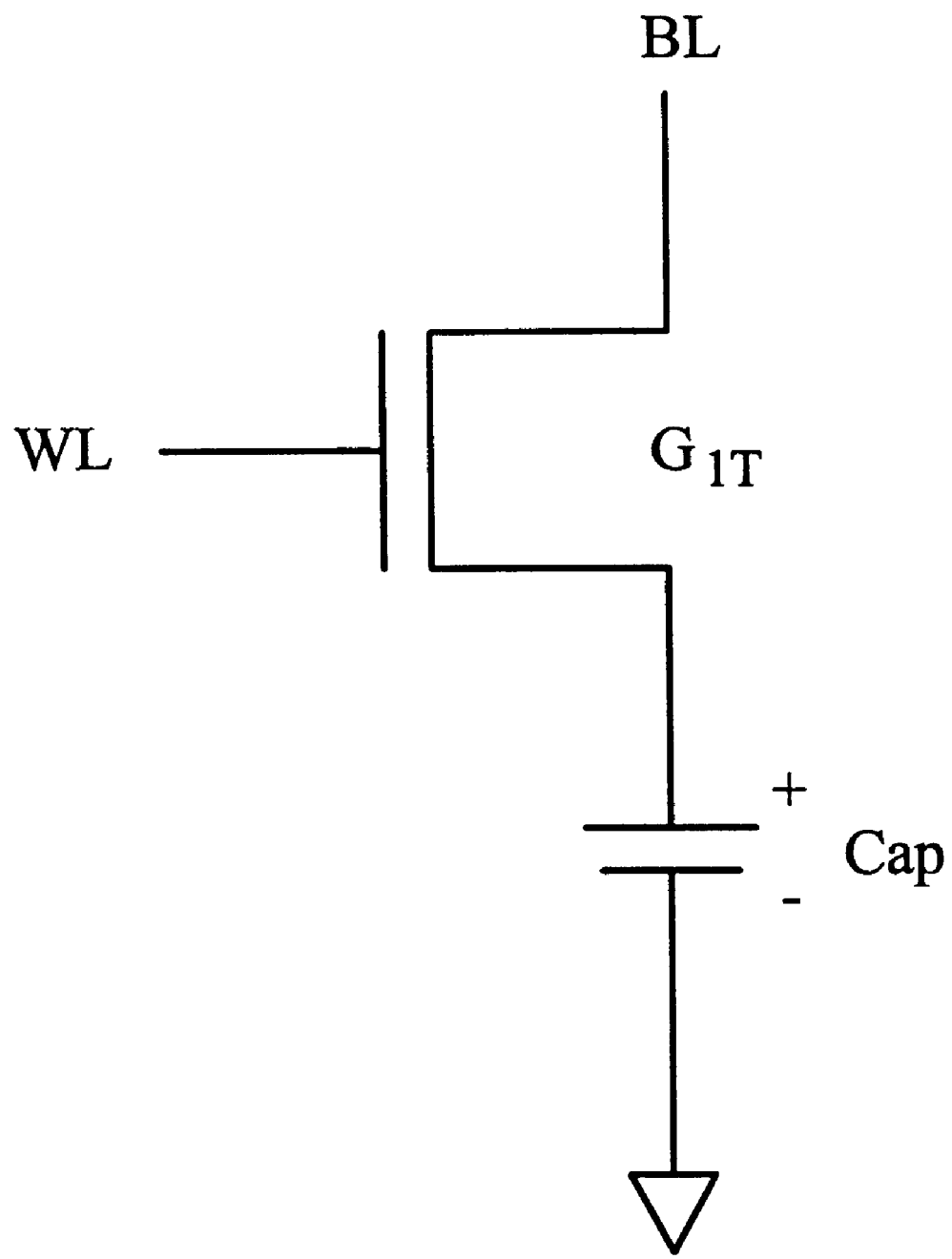
FIG. 1 is a schematic diagram of a unit of cell of the typical 1-Transistor memory.
Figure 2:
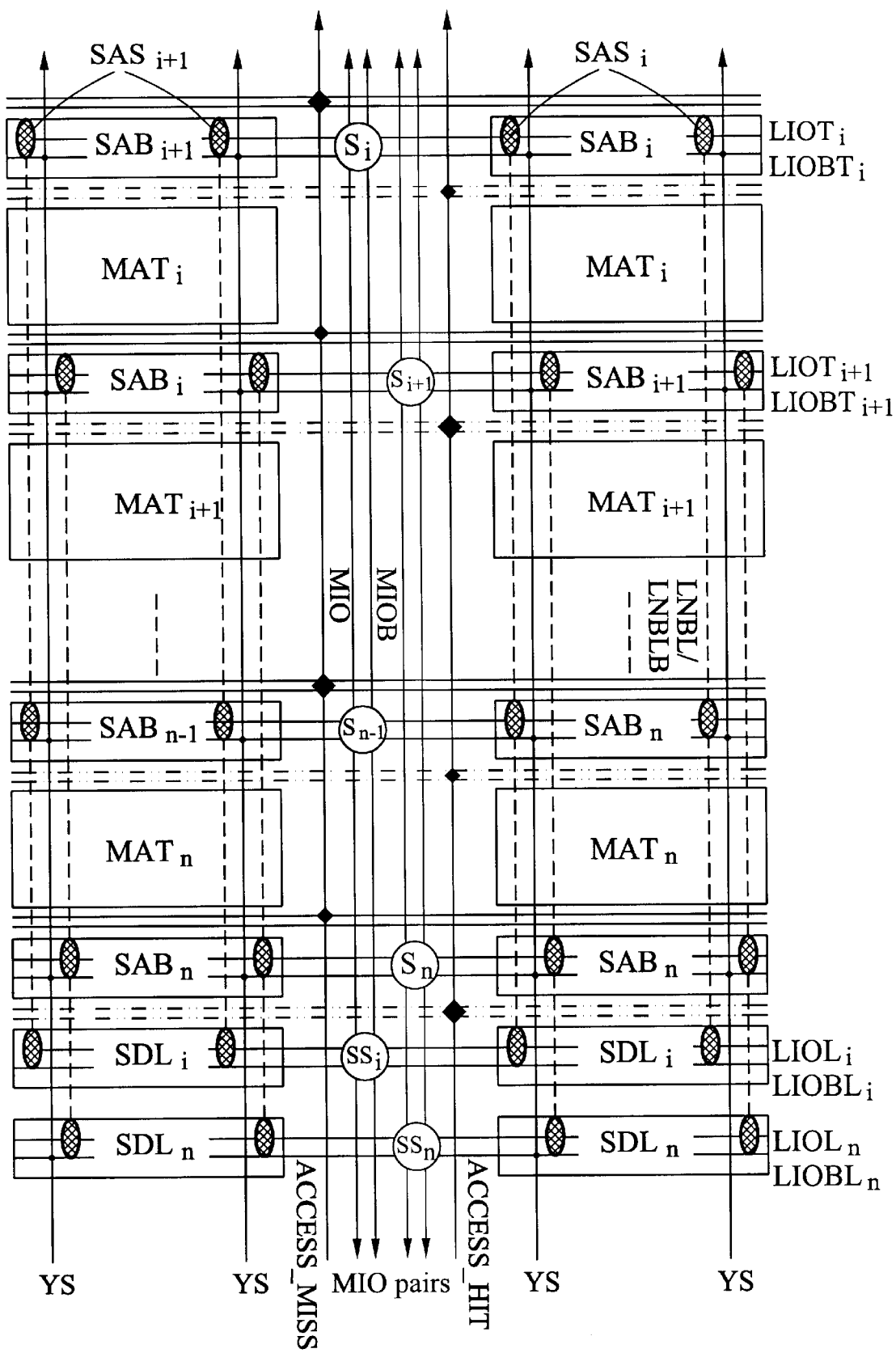
FIG. 2 a schematic diagram of a 1-Transistor memory structure of the invention.

FIG. 2 is a schematic diagram of a 1-Transistor memory structure of the invention. In FIG. 2, the structure includes memory arrays MAT (i.e., MATi to MATn), sense amplifier banks SAB (i.e., SABi to SABn), sense amplifier selectors SAS (i.e., $SAS_i$ to $SAS_n$), shared data latches SDL (i.e., SDLi to SDLn), column selectors YS, and switches S (i.e., $S_i$ to $S_n$ and $SS_i$ to $SS_n$). As shown in FIG. 2, in the configuration, an operating unit of memory includes a memory array and a sense amplifier bank, which implements a pair of sense amplifier selectors on its two laterals, for example, MAT i, SAB i and two $SAS_i$ on two laterals of the $MAT_i$. Each sense amplifier selector selects the collision solution path based on the cycle signal ACCESS_MISS or ACCESS_HIT. If the signal ACCESS_MISS is selected, a pair of local input/output buses LIO (i.e., pairs $LIOT_i$, $LIOBT_i$ and $LIOT_{i+1}$, $LIOBT_{i+1}$ for $SAB_i$ and $SAB_{i+1}$ or pairs $LIOL_i$, $LIOBL_i$ and $LIOL_n$, $LIOBL_n$ for $SDL_i$ and $SDL_n$) is used, otherwise, if the signal ACCESS_HIT is selected, the bitline is used. Moreover, two operating units of memory, for example, $MAT_i$, $SAB_i$, $SAB_{i+1}$, $SAS_i$ and $SAS_{i+1}$ are arranged in parallel and connected with main input/output buses MIO. One of switches is used to select the respective buses MIO or LIO to be used, i.e., $S_i$–$S_n$ for selecting the MIO or LIO respectively connected to $SAB_i$–$SAB_n$ and SSi–$SS_n$ for selecting the MIO or LIO respectively connected to $SDL_i$–$SDL_n$. A shared data latch is implemented with one to a plurality of operating units of memory connected subsequently. For example, as shown in FIG. 2, the odd and even memory arrays MAT located from MAT (i–1) to MAT n are connected to SAB i and SAB n, respectively. A shared data latch is normally implemented with respect to 8 memory sectors (arrays), but this can be changed according to the actual environment in memory implementation. Thus, the structure of FIG. 2 is completed.

Figure 3:
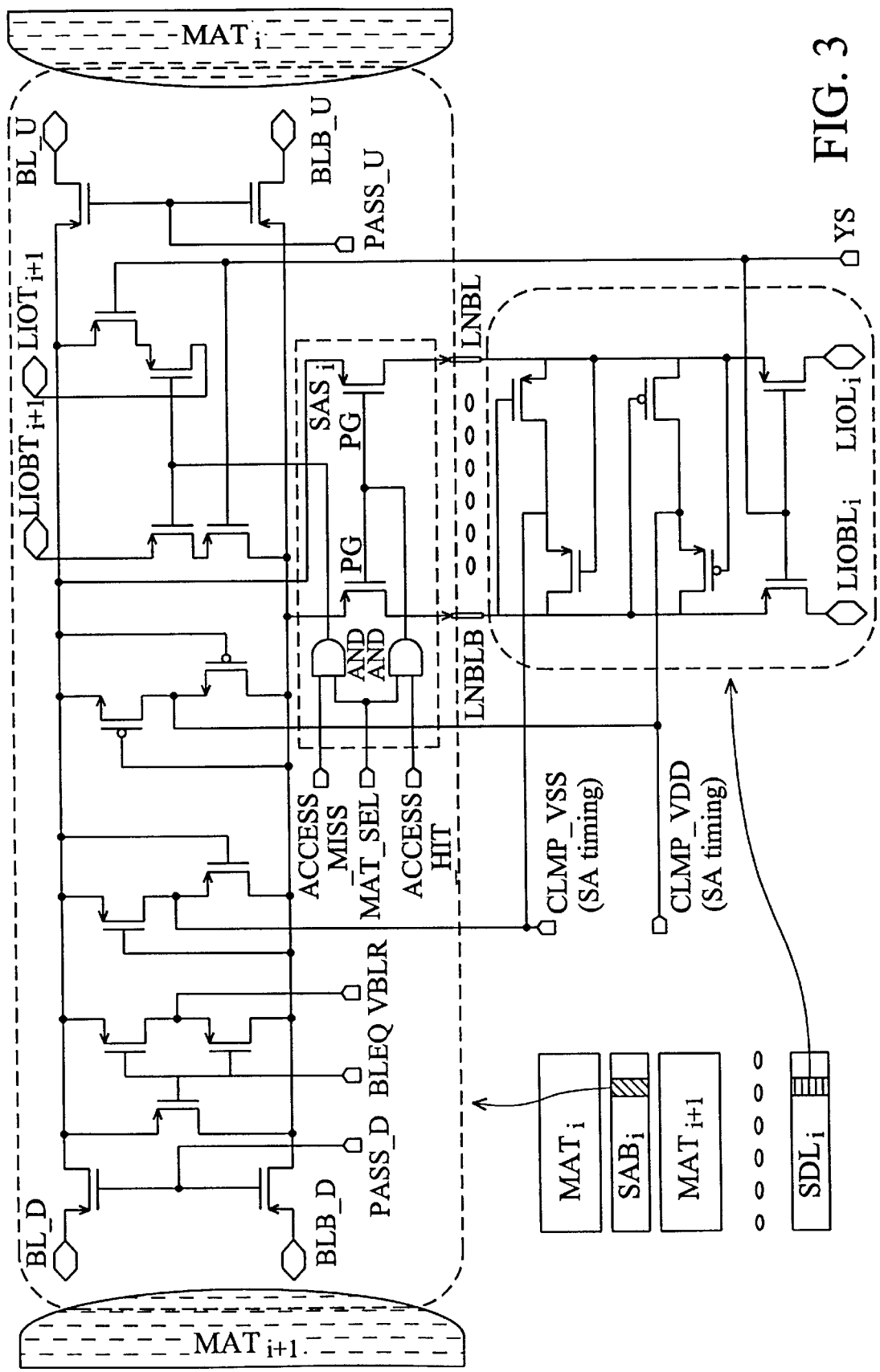
FIG. 3 s a schematic diagram of hidden refresh circuit portion of FIG. 2.

FIG. 3 is a schematic diagram of the hidden refresh circuit portion of FIG. 2. In FIG. 3, the hidden refresh circuit portion includes part of the sense amplifier bank SAB i between memory arrays MAT i and MAT i+1 and part of the shared data latch SDL i. As shown in FIG. 3, the selector SAS i is formed of two AND gates and two passgates PG. When signal MAT_SEL is logic 1, this MAT i is selected for the memory data access. At this time, the cycle signals ACCESS_HIT and ACCESS_MISS are used to determine if the collision between the data access and refresh happened in this MAT and further determine which data transmission path (bus) is used according to the cycle signal. The signal ACCESS_HIT is indicative that the collision happened in a data access cycle while the signal ACCESS_MISS is indicative that the collision did not happen in a data refresh cycle. As shown in FIGS. 2 and 3, if the collision happened on the data access cycle, the access data signal amplified by the sense amplifier bank SAB is sent to the respective data latch SDL through the long bitline LNBL/LNBLB. Concurrently, the data latch SDL outputs the access data signal through the main input/output bus MIO and the respective local input/output bus LIOL to complete the external access request. On the other hand, if the collision happened on the data refresh cycle, the refresh data signal amplified by the sense amplifier bank SAB is sent to the respective data latch SDL through the long bitline LNBL/LNBLB. Next, the data latch SDL is amplified in the sense amplifier bank SAB and outputs the amplified access data signal through the main input/output bus MIO. After completing the external access request, the refresh data signal stored in the data latch SDL is restored to the memory bank MAT through the original long bitline LNBL/LNBLB and the original sense amplifier bank SAB to complete the refresh action. For example, when the data signal MAT i has the collision on the access cycle, the long bitline LNBL/LNBLB is enabled in order to output the access data signal to the latch SDL i. When the data signal in the array MAT i is refreshed in the bank SAB i, the respective buses LIOLi and MIO of the latch SDL i are concurrently enabled by the latch SDL i such that the access data signal stored in the latch SDL i can be output through the two buses LIOLi and MIO. Hence, the data access action and the data refresh action are concurrently completed. When the data signal MAT i has the collision on the refresh cycle, the long bitline LNBL/LNBLB is enabled in order to output the refresh data signal to the latch SDL i. The data signal in the array MAT i is amplified by the bank SAB i and output through the bus MIO to complete the access action. After the access action is completed, the long bitline LNBL/LNBLB is enabled and the bus MIO is disabled. Thus, the refresh data signal stored in the data latch SDL is restored to the memory bank MAT through the enabled long bitline LNBL/LNBLB to complete the refresh action.

Figure 4:
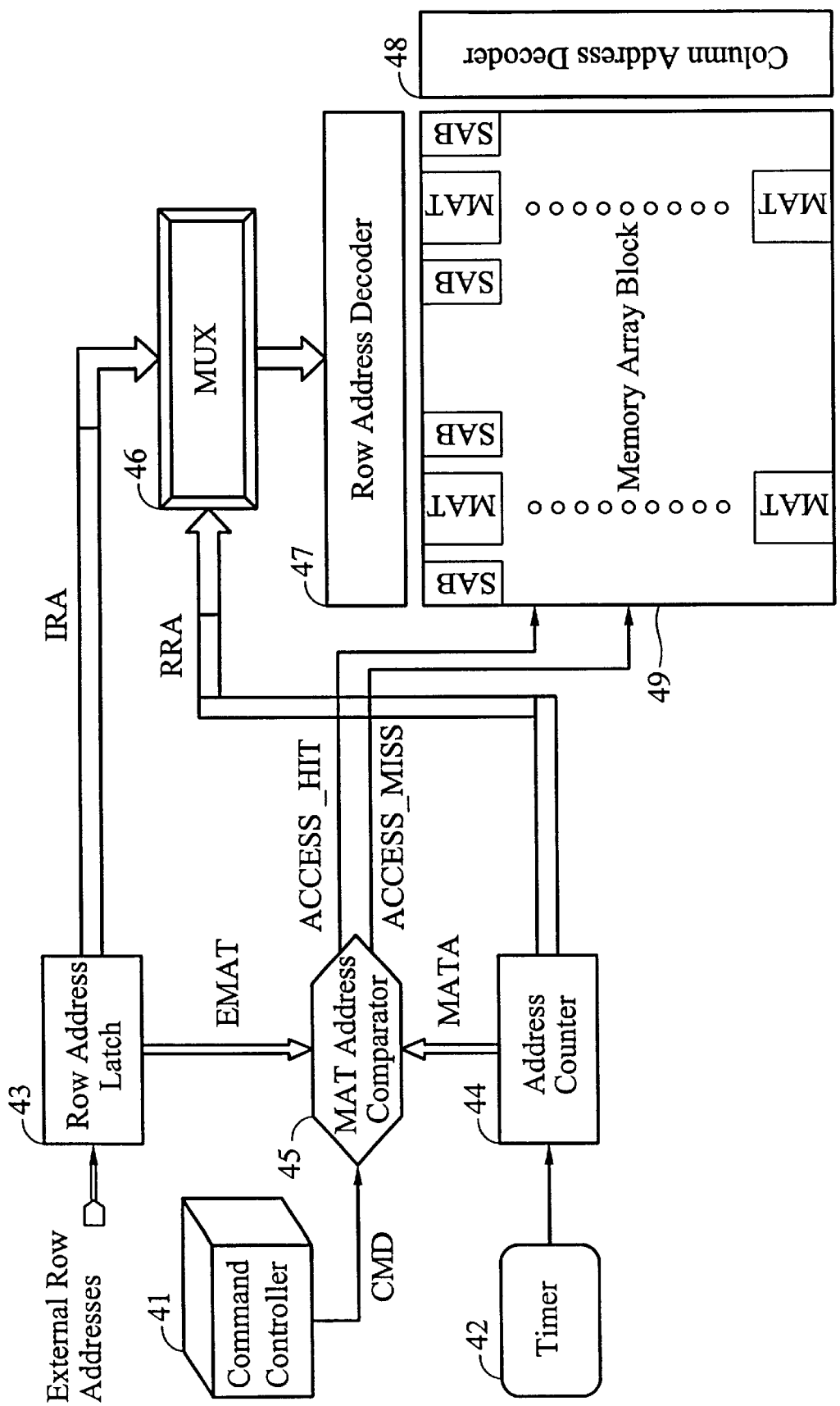
FIG. 4 is a diagram of the operating structure according to the invention.

FIG. 4 is a diagram of the operating structure according to the invention. In FIG. 4, the operating structure includes a command controller 41, a timer 42, a row address latch 43, an address counter 44, a MAT address comparator 45, a multiplexer 46, a row address decoder 47, a column address decoder 48 and a memory array block 49. As shown in FIG. 4, when a collision appears, the row address latch 43 receives an external row address and outputs the MAT address EMAT having the external row address to the MAT address comparator 45. The MAT address comparator 45 utilizes the control signal CMD of the command controller 41 to compare the address EMAT with the MAT address MATA come from the address counter 44 according to the timer 42. Thus, the comparator 45 outputs the cycle signals ACCESS_HIT and ACCESS_MISS to determine on which operating cycle the collision happens. At this point, the latch 43 and the counter 44 input an internal row address IRA and a row address RRA, respectively, to the multiplexer 46. The multiplexer 46 controls the address decoding via the row address decoder 47 and the column address decoder 48 and selects the memory array block 49 (the structure as shown in FIG. 2) to perform hidden refresh or access data function based on the decode. The performance of hidden refresh or data access follows.

Figure 5:
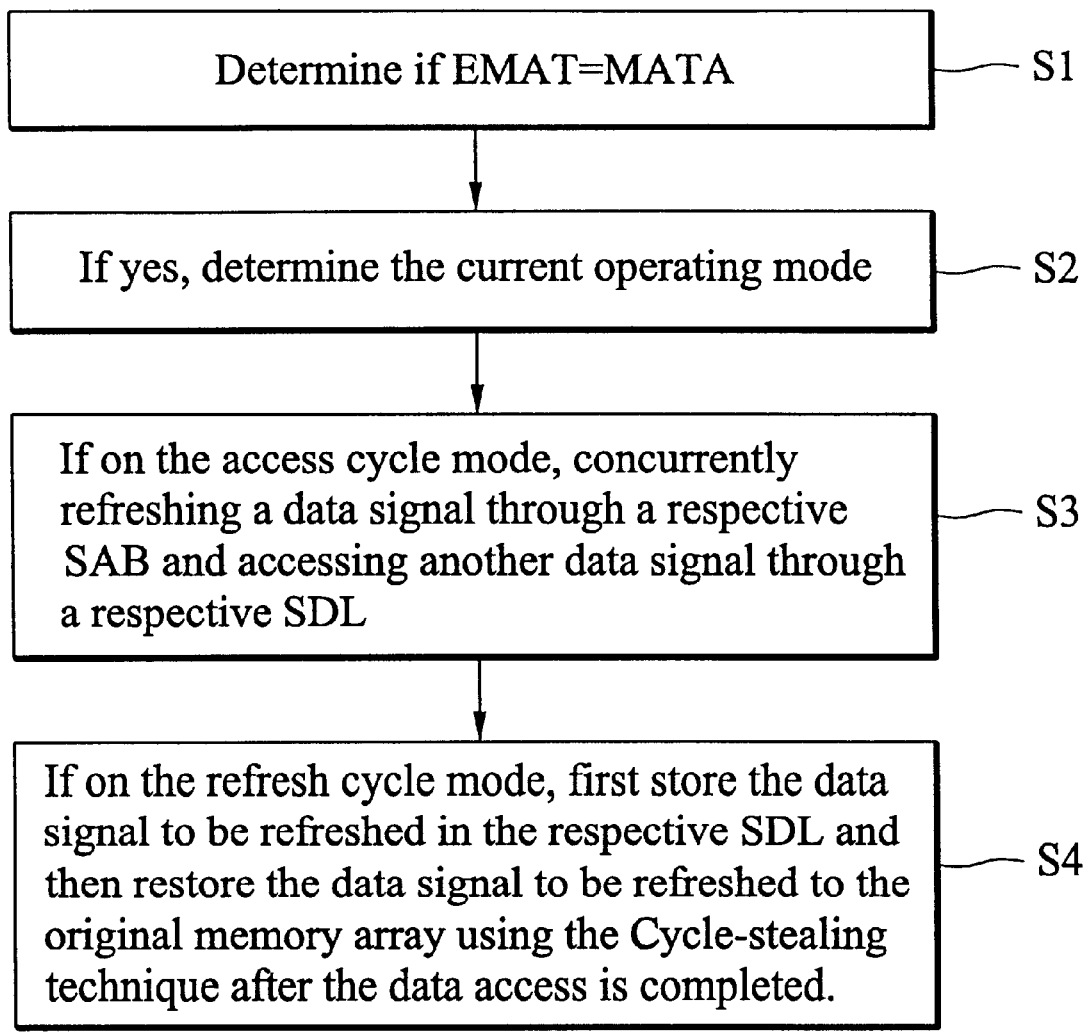
FIG. 5 is a flowchart of FIG. 4 according to the invention.

FIG. 5 is a flowchart of FIG. 4 according to the invention. In FIG. 5, an operating method includes the following steps: determining if the collision between data access and data refresh is addressed in the same memory array (S1); determining the currently operating mode if the collision happened in the same memory array (S2); if on the data access cycle mode, concurrently refreshing a data signal through a respective sense amplifier bank (SAB) and accessing another data signal through a respective shared data latch (SDL) (S3); if on the data refresh cycle mode, first storing the data signal to be refreshed in the shared data latch and then restoring the data signal to be refreshed to the original memory array using the cycle-stealing technique after the data access is completed (S4).

As shown in FIG. 5, the operating method is described with reference to FIGS. 2, 3 and 4 as follows. First, in step S1, determining if the collision between data access and data refresh is addressed in the same memory array is performed with the comparator by determining if EMAT=MATA as shown in FIG. 4. Then, in step S2, if EMAT=MATA, the collision happened. At this time, the comparator has to further determine which operating cycle mode is on. That is, the cycle signals ACCESS_HIT and ACCESS_MISS output by the comparator are used to determine the next processing, including the bus path to be used to transmit the data to the data latch SDL. The signal ACCESS_HIT is indicative that the collision happened in a data access cycle while the signal ACCESS_MISS is indicative that the collision did not happen in a data refresh cycle as shown in FIGS. 2 and 3. Finally, in step S3, if the collision happened on the data access cycle, the access data signal amplified by the sense amplifier bank SAB is sent to the respective data latch SDL through the long bitline LNBL/LNBLB. Concurrently, the data latch SDL outputs the access data signal through the main input/output bus MIO and the respective local input/output bus LIOL to complete the external access request. On the other hand, in step S4, if the collision happened on the data refresh cycle, the refresh data signal amplified by the sense amplifier bank SAB is sent to the respective data latch SDL through the long bitline LNBL/LNBLB. Next, the data latch SDL is amplified in the sense amplifier bank SAB and outputs the amplified access data signal through the main input/output bus MIO. After the external access is completed, the refresh data signal stored in the data latch SDL is restored to the memory bank MAT through the original long bitline LNBL/LNBLB and the original sense amplifier bank SAB to complete the refresh action. The well-known cycle-stealing technique in the art, which utilizes the switching time between the cycle modes to complete the restored action, is used.

Although the invention has been described in its preferred embodiment, it is not intended to limit the invention to the precise embodiment disclosed herein. Those who are skilled in this technology can still make various alterations and modifications without departing from the scope and spirit of this invention. Therefore, the scope of the invention shall be defined and protected by the following claims and their equivalents.

What is claimed is:

1. 1-T memory structure capable of performing hidden refresh, the 1-T memory structure comprising:
   a plurality of memory arrays for storing data signal;
   a plurality of sense amplifiers for amplifying the data signal of the respective memory array and temporarily storing the amplified data signal;
   a selector for selecting the amplified data signal through a bus based on a cycle-indicative signal; and a shared data latch for receiving and storing the amplified data signal selected by the selector.

2. The 1-T memory structure of claim 1, wherein the cycle-indicative signal is a data access cycle signal.

3. The 1-T memory structure of claim 1, wherein the cycle-indicative signal is a data refresh cycle signal.

4. The 1-T memory structure of claim 1, wherein the bus is a long bitline pair.

5. A 1-T memory structure capable of performing hidden refresh, the 1-T memory structure comprising:

a row address latch for receiving a row address data signal externally input and outputting a memory array address with the row address data signal;

a timer for outputting a timing signal to control a current row address;

an address counter for outputting a memory array address with the current row address according to the timing signal;

an address comparator for comparing the memory array address with the row address data signal and the memory array address with the current row address, thereby outputting a comparison result;

a command controller for outputting an operating cycle signal according to the comparison result;

a multiplexer for respectively receiving addresses from the row address latch and the address counter and thereby producing a row address;

a row address decoder for decoding the row address from the multiplexer;

a memory array for outputting a data signal according to the row address;

a sense amplifier for amplifying and temporarily storing the data signal output from the memory array;

a selector for outputting the data signal amplified by the sense amplifier through a bus according to the operating cycle signal; and a shared data latch for receiving and storing the data signal output by the selector.

6. The 1-T memory structure of claim 5, wherein the cycle-indicative signal is a data refresh cycle signal.

7. The 1-T memory structure of claim 5, wherein the cycle-indicative signal is a data access cycle signal.

8. The 1-T memory structure of claim 5, wherein the bus is a long bitline pair.

9. An operating method having a 1-T memory structure capable of performing hidden refresh, comprises the steps:

determining if a collision between data access and data refresh is addressed in a same memory array;

determining a currently operating mode if the collision happened in the same memory array;

if on a data access cycle mode, concurrently refreshing a data signal through a respective sense amplifier bank (SAB) and accessing another data signal through a respective shared data latch (SDL); and if on a data refresh cycle mode, first storing the data signal to be refreshed in the respective shared data latch and then restoring the data signal to be refreshed to the same memory array using a cycle-stealing technique after the data access cycle is completed.

10. An operating method of claim 9, wherein in the step of if on a data access cycle mode, the another data signal is transmitted by a bus to the respective shared data latch and accessed through a respective local input and output bus and a respective main input and output bus.

11. An operating method of claim 10, wherein the bus utilizes a long bitline pair.

12. An operating method of claim 9, wherein in the step of if on a data refresh cycle mode, the data signal to be refreshed is transmitted by a bus to the respective shared data latch.

13. An operating method of claim 12, wherein the bus utilizes a long bitline pair.

14. An operating method of claim 9, wherein the cycle-stealing technique utilizes the switch time between the data access cycle mode and the data refresh cycle mode to perform storing the data signal to be refreshed to the same memory array.

* * * * *